United States Patent [19]

Doyen et al.

[11] 4,425,575
[45] Jan. 10, 1984

[54] BASE FOR ENCAPSULATING COMPONENTS WITH COPLANAR ELECTRODES

[75] Inventors: Jean Doyen; Philippe Morel; Jean C. Resneau, all of Paris, France

[73] Assignee: Thomson-CSF, Paris, France

[21] Appl. No.: 315,269

[22] Filed: Oct. 26, 1981

[30] Foreign Application Priority Data

Oct. 31, 1980 [FR] France .............................. 80 23381

[51] Int. Cl.³ .................... H01L 23/02; H01L 39/02; H01L 23/16; H01L 23/48
[52] U.S. Cl. ..................................... 357/81; 357/68; 357/70; 357/75; 357/80
[58] Field of Search ................... 357/80, 75, 68, 69, 357/70, 65, 81; 174/52 R, 52 FP; 361/405, 406; 29/580, 591

[56] References Cited

U.S. PATENT DOCUMENTS 3,996,603 12/1976 Smith ................................. 357/80

FOREIGN PATENT DOCUMENTS 57-95652 6/1982 Japan .................................... 357/81
WO82/02980 9/1982 PCT Int'l Appl. .................. 357/75

Primary Examiner—Martin M. Edlow
Assistant Examiner—J. L. Bodgett
Attorney, Agent, or Firm—Cushman, Darby & Cushman

[57] ABSTRACT

A base comprising a metal mounting stud to which is fixed a locally metallized insulating plate of the beryllium oxide type. In order to very accurately position active or passive component or components on the insulating plate, at least one connecting electrode comprises at least one abutment zone against which is placed at least one component. This makes it possible to obtain a very good reproducibility of the electrical performances of the device. Such a mounting is applied to ultra-high frequency devices, particularly those incorporating a pre-matching circuit.

7 Claims, 4 Drawing Figures

BASE FOR ENCAPSULATING COMPONENTS WITH COPLANAR ELECTRODES

BACKGROUND OF THE INVENTION

The invention relates to a base for an encapsulating case for components having coplanar electrodes, with means for the precise positioning of the components in order to ensure a good reproducibility of the mounting of the components on the base and the electrical characteristics, particularly in the field of ultra-high frequencies.

In this type of application, the components are encapsulated or enclosed in cases which very often contain a plurality of components, such as for example two transistors and two capacitors hard soldered or brazed to the same base. Thus, in the field of ultra-high frequencies it is necessary to match the circuit in question in order to match the impedances and it is known that the length of the connections increases in importance with the frequency. The accuracy required is sufficiently high to take into consideration the positioning of the components on the base to which they are fixed.

An encapsulating case with coplanar electrodes is constituted by the following elements:

a mounting stud, which also serves to dissipate the heat given off during the operation of the semiconductor chips and made from a metal or alloy often copperbased;

an insulating plate, preferably of beryllium oxide due to the very good thermal conductivity of this compound, the insulating plate incorporating localized metallization regions to which are hard soldered the active components such as transistors and passive components such as capacitors or the output terminals of the device;

a connecting grid cut from a single metal plate and which forms the input and output terminals of the device;

a cover which both seals and protects the device.

The difficulties to solve are essentially linked with the very precise positioning of the active and passive components on the base of the encapsulating case, the base being formed by the mounting stud, the insulating plate brazed to the latter and the connecting grid brazed on the insulating plate.

This positioning is vital for a number of reasons. If the device only has a single active component and the latter is, for example, an ultra-high frequency transistor, it is still vital that it is positioned with a great deal of accuracy in order that all the transistors of a same production batch have the same electrical characteristics at the end of manufacture, so that they will be interchangeable in ultra-high frequency equipments in which they are to be used. If the device comprises a plurality of active and passive components, e.g. because the power level required necessitates the parallel connection of several transistor chips, the aforementioned reasons still apply, but in addition it is important that all the components on the same base are reciprocally positioned with a great deal of accuracy in order to obtain a good overall reproducibility of the mounting arrangement.

BRIEF SUMMARY OF THE INVENTION

The invention provides a solution to this problem of the very precise positioning of the active and passive chips by providing the connection grid with abutment zones for fitting with the chips, in particular during their hard soldering and when the hard solder is in the molten state.

More specifically, the present invention relates to a base for a case for encapsulating components with coplanar electrodes, comprising a metal mounting stud, an electrically insulating plate and external connecting electrodes hard soldered to metallizations deposited on the insulating plate in the plane of its free surface, wherein in order to permit a very precise positioning of the components to be encapsulated, the base comprises on at least one of the outer connections, an abutment zone integral with the connection and against which is placed at least one component during the operation of welding said component to the base.

BRIEF DESCRIPTION OF THE DRAWINGS

The invention is described in greater detail hereinafter relative to preferred embodiments and with reference to the attached drawings, wherein show.

DETAILED DESCRIPTION OF THE PREFERRED EMBODIMENTS

Figure 1:
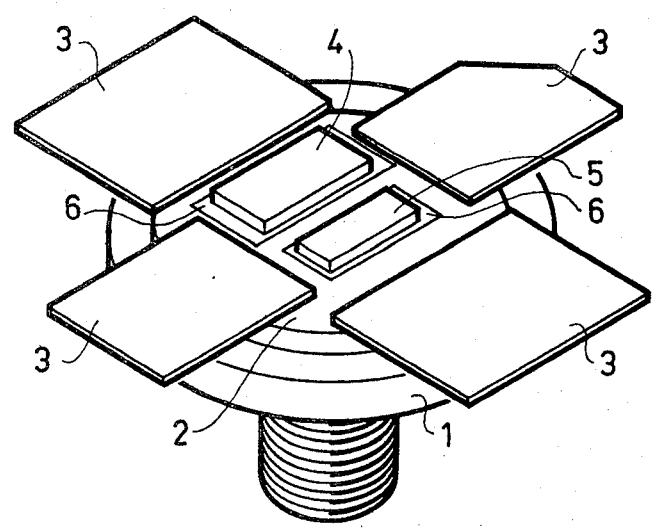
FIG. 1 an encapsulating case base according to the prior art.

The description of the present invention is based on embodiments in which neither the shape nor the number of external connections of the grid, nor the number or quality of the active and passive components fixed to the base in any way limit the invention. FIG. 1 is a view in space of a base of an encapsulating case according to the prior art.

This base, shown prior to closure by a cover, is formed by a mounting stud, which is sometimes made from steel, but more frequently from a copper-based metal or a copper alloy, whose heat transfer coefficient assists the dissipation of heat. To the said mounting base is hard soldered an insulating plate 2 made from alumina or preferably beryllium oxide, due to the remarkable heat transfer properties of the latter. The entire lower surface of the insulating plate 2 is metallized so that it can be hard soldered to the metal mounting stud 1 and certain zones of its upper surface are also metallized. Input and output connections 3 of the encapsulated device are hard soldered to certain of the zones of the insulating plate 2. These connections 3 form what is called the connection grid because they are initially arranged in the form of a grid, whose contour is then stamped or cut. The active and/or passive components 4 and 5 are welded to other upper metallization zones of the insulating plate. FIG. 1 shows purely for illustrative purposes, two components 4 and 5, which have been hard soldered to welding preforms 6. When the device is in the "as manufactured" state shown in FIG. 1, connecting wires, which are not shown in the drawing, are welded between the components and adequate output connections, or between the components themselves. The device is then protected and sealed by a not shown cover.

The encapsulating base shown in FIG. 1 is diagrammatic in the sense that the shapes and numbers of the components constituting the same, i.e. the active and passive components or output connections have been simplified. However, it is easy to see that if the device comprises a plurality of active pellets and prematching components, the very precise positioning thereof relative to one another becomes of an increasing random nature when the number of components increases. The reason is that the risk of a component being poorly positioned and poorly welded increases making it necessary to discard the device during the final sorting at the time of electrical testing. It is to obviate these defects of production and regularity in the electrical characteristics that the present invention proposes the means shown in FIG. 2.

Figure 2:
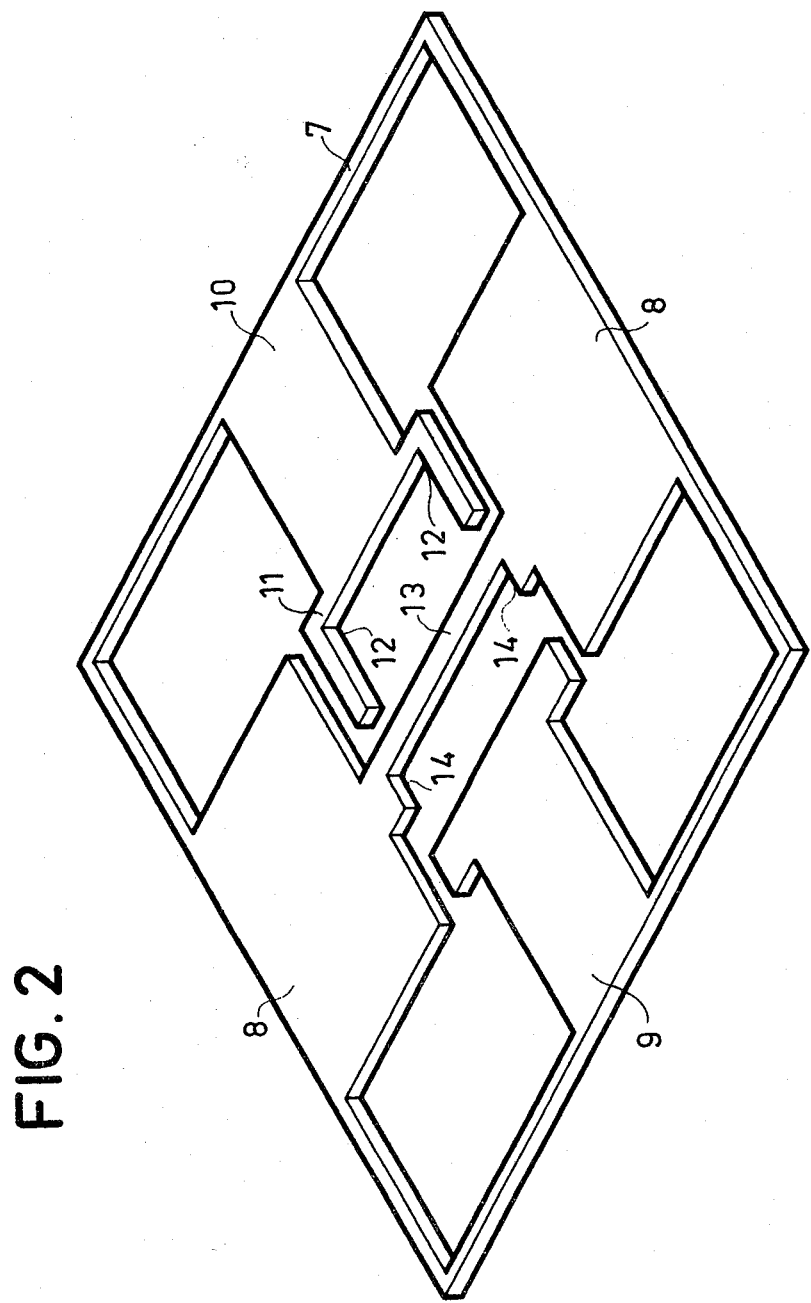
FIG. 2 a connection grid according to the invention.

FIG. 2 shows a connecting grid according to the invention. This grid comprises outer electrodes or connections 8, 9 and 10. This grid is shown in the state assumed by it during the fitting of the device, all the outer connections 8, 9 and 10 being fixed by means of a positioning frame 7.

The invention consists in shaping certain of the external connections as a function of the positioning requirements. The ends of one or several of the outer connections are provided with abutment zones against which the components or chips engage during their hard soldering to the base.

In the drawing, the end 11 of the connection 10 comprises two corner-shaped abutment zones 12 so as to place one component or chip in each of the thus formed brackets 12. These abutment zones could merely consist of a single bar or could comprise a single bracket or two brackets in the manner shown, or a plurality of positioning abutment brackets.

Another case of precise fixing is shown in FIG. 2 between the two outputs connections 8 which, in this case, are mounted in parallel to ensure e.g. a higher output current from the device. These two connections are joined by an abutment zone 13 completed by two projecting portions 14 for the positioning of two other components in the device. As in the case of the first abutment 11, abutment 13 may comprise one or a plurality of precise locating and fixing positions.

The main feature of these positioning abutments is that they are integral with the connecting grid and in the same plane as the latter. They can be produced by stamping, chemical cutting or electroforming during the manufacture of the grid. They may also be joined and welded to a standard prior art grid. Neither the number nor the shape of the abutments is limited, although the bracket shape which is likened to the positioning axes is the most appropriate. The abutments must be thin enough to ensure that they do not intervene in the operation of the device by shortcircuiting a MOS capacitor in the thickness thereof or a transistor between the substrate and the active layers.

The grid, which is monolithic in the production stage of the electronic device, is welded to the insulating plate comprising metallizations adapted to the contours of the connections 8, 9 and 10. Metallization regions are also provided for the welding of the components. With the grid joined to the base in this way, the components are welded to metallizations of the insulating plate with stirring so as to improve the wettability and the thermal and electrical contact between the component chips and the supports, this welding being carried out while the chips are abuted against the connection end as explained hereinabove. For example, in the case of FIG. 2, two components can be placed against abutment 11 in the two brackets 12 and two components can be placed against abutment 13 in the two brackets 14.

Figure 3:
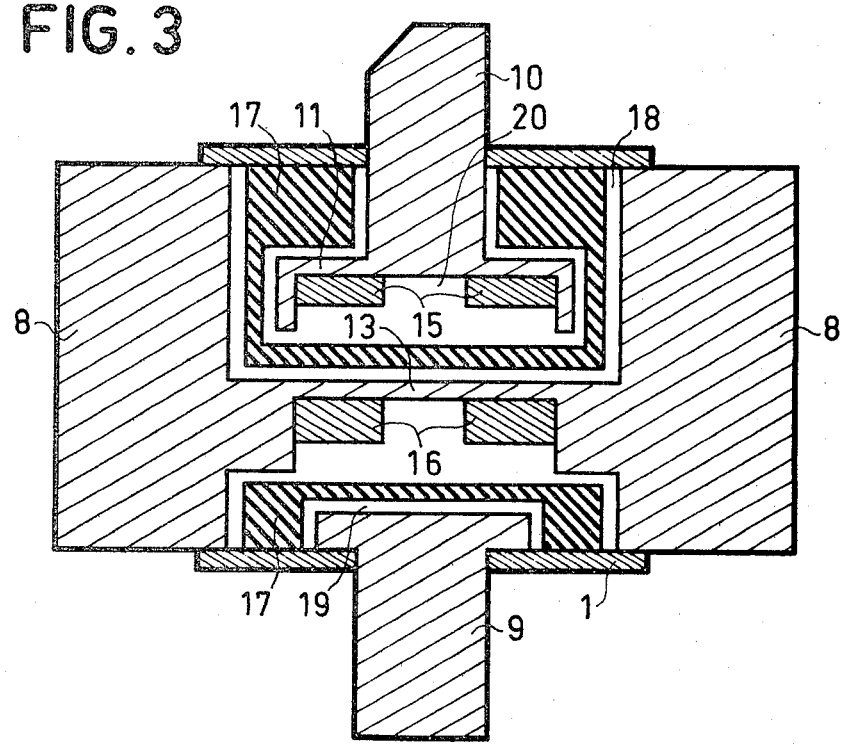
FIG. 3 a plan view of a device mounted on a base according to the invention.

FIG. 3 is a plan view of a device mounted on a base according to the invention. In FIG. 3, the stud 1 and the insulating plate 2 have a square shape and not a circular one as in FIG. 1.

The two output connections 8 electrically connected by means of the abutment zone 13 in order to increase the available power are welded to a metallized region 18 of the insulating plate 2 which slightly projects beyond the contour of connections 8. Connection 9 is welded to a metallized region 20. No metallized portions 17 of the surface of the insulating plate 2 appear between the metallizations 18, 19 and 20. Metallization 20 comprises a region onto which are welded the two components 15 in abutment with the zones 11, 12. In the same way, metallization 18 comprises a region on to which are welded two other components 16 in abutment with the zones 13, 14. This plan view does not show connecting wires running from the component chips 15, 16 to the output connections or between the chips.

Due to the fact that the output connections are welded to the insulating plate in a collective manner, the different output connections 8, 9 and 10 are perfectly fixed in position relative to one another as are abutments 11 and 13 because they are integral with the connection grid.

Figure 4:
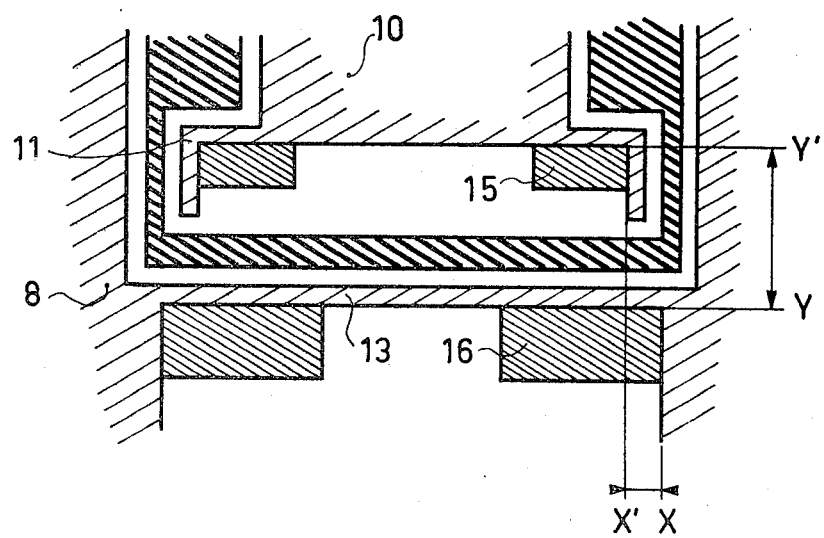
FIG. 4 a plan view showing the positioning of the components on a base according to the invention.

FIG. 4 shows the central part of FIG. 3 and depicts the ends of connections 8 and 10, as well as the four components 15 and 16 abuting against the brackets of abutments 11 and 13. Components 15 and 16 are precisely positioned with respect to one another along the XX' and YY' directions by the abutment zones provided in the connecting grid.

The invention as described on the basis of an embodiment comprising four components and two abutments equipped with brackets in fact covers the more general case of one or more brackets integral with one or more connections and having precise locating means, the bracket being the most suitable configuration for the square or rectangular shape of the active or passive component chips. A transducer having a plurality of brackets falls within the scope of the invention.

In addition, although the precise positioning of components is crucial in the field of semiconductors working in the ultra-high frequency range, the invention also applies to any other field of microelectronics in which importance is attached to the regularity of the electrical characteristics for mass production purposes and can be modified according to variants well known to the Expert.

What is claimed is:

1. A base for encapsulating components with coplanar electrodes, comprising a metal mounting stud, an insulating plate and connecting electrodes hard soldered to metallizations deposited on the insulating plate, wherein at least one of the connecting electrodes comprises an abutment zone against which is placed at least one component welded to a metallization of the insulating plate.

2. A base according to claim 1, wherein the abutment zone comprises at least one positioning bracket in which is placed at least one component.

3. A base according to claim 1, wherein the connecting electrode and the abutment zones are produced simultaneously from a single metal sheet forming a precise and non-deformable connection grid, whose outer contour is cut or stamped out after hard soldering to the base.

4. A base according to claim 3, wherein said grid is made by stamping.

5. A base according to claim 3, wherein said grid is made by chemical etching.

6. A base according to claim 3, wherein said grid is made by electro-forming.

7. A base according to claim 1, wherein said abutment zone constitutes a bridge between two external connections.

* * * * *